(12) United States Patent
Lu et al.

(10) Patent No.: US 7,642,631 B2
(45) Date of Patent: Jan. 5, 2010

(54) PACKAGED SEMICONDUCTOR CHIP COMPRISING AN INTEGRATED CIRCUIT CHIP ABLATED WITH LASER AND CUT WITH SAW BLADE FROM WAFER

(75) Inventors: Szu Wei Lu, HsinChu (TW); Hsin-Hui Lee, Kaohsiung (TW); Ming-Chung Sung, Taichung (TW); Mirng-Ji Lii, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 132 days.

(21) Appl. No.: 11/777,878

(22) Filed: Jul. 13, 2007

(65) Prior Publication Data

US 2007/0257365 A1 Nov. 8, 2007

Related U.S. Application Data

(63) Continuation of application No. 11/174,710, filed on Jul. 5, 2005, now Pat. No. 7,265,034.

(60) Provisional application No. 60/654,285, filed on Feb. 18, 2005.

(51) Int. Cl.
*H01L 23/02* (2006.01)
(52) U.S. Cl. .................................... 257/685
(58) Field of Classification Search ............... 257/110, 257/940, 460–463, 685, 723, E25.031–E25.032; 438/109
See application file for complete search history.

(56) References Cited

U.S. PATENT DOCUMENTS 5,059,764 A 10/1991 Baer
5,786,266 A 7/1998 Boruta
6,117,347 A 9/2000 Ishida (Continued)

FOREIGN PATENT DOCUMENTS

CN 1525536 9/2004

(Continued)

OTHER PUBLICATIONS

Lee, J.-M., et al., "Scribing and cutting of sapphire wafer with Q-switched Nd:YAG laser," CLEO Pacific Rim '99, IEEE, pp. 366-367.

(Continued)

*Primary Examiner*—Calvin Lee
(74) *Attorney, Agent, or Firm*—Slater & Matsil, L.L.P.

(57) ABSTRACT

A packaged semiconductor chip comprising an integrated circuit chip including a low-k dielectric layer and a chip substrate, wherein an edge of the integrated circuit chip has a first edge portion and a second edge portion. At least part of the first edge portion being across a same level as the low-k dielectric layer, and the first edge portion having been laser ablated to have a series of rounded recesses formed therein. The second edge portion being across a same level as at least part of the chip substrate, and the second edge portion having a different surface texture than that of the first edge portion. The packaged semiconductor chip also comprises a packaging substrate having the integrated circuit chip attached and a plurality of solder bumps electrically connecting between the packaging substrate and the integrated circuit chip.

20 Claims, 5 Drawing Sheets

U.S. PATENT DOCUMENTS

| | | |
|---|---|---|
| 6,399,463 B1 | 6/2002 | Glenn et al. |
| 6,420,245 B1 | 7/2002 | Manor |
| 6,492,197 B1 * | 12/2002 | Rinne .......................... 438/108 |
| 6,562,698 B2 | 5/2003 | Manor |
| 6,570,259 B2 | 5/2003 | Alcoe et al. |
| 6,583,039 B2 | 6/2003 | Chen et al. |
| 6,596,562 B1 | 7/2003 | Maiz |
| 6,667,230 B2 | 12/2003 | Chen et al. |
| 6,696,356 B2 | 2/2004 | Tseng et al. |
| 6,804,086 B2 | 10/2004 | Jones |
| 7,064,014 B2 * | 6/2006 | Dias et al. ................... 438/122 |
| 7,081,661 B2 | 7/2006 | Takehara et al. |
| 7,129,114 B2 * | 10/2006 | Akram ........................ 438/110 |
| 7,320,930 B2 * | 1/2008 | Eshleman .................... 438/462 |
| 2006/0169680 A1 * | 8/2006 | Park ....................... 219/121.68 |

FOREIGN PATENT DOCUMENTS

JP     2005 019 667     1/2005

OTHER PUBLICATIONS

Zhao, A., et al.; "Low k Materials for ULSI Application"; Semiconductor Technology, Feb. 2004; vol. 29 No. 2, pp. 4-6, 45.

* cited by examiner

PACKAGED SEMICONDUCTOR CHIP COMPRISING AN INTEGRATED CIRCUIT CHIP ABLATED WITH LASER AND CUT WITH SAW BLADE FROM WAFER

This application is a continuation application of U.S. application Ser. No. 11/174,710, filed on Jul. 5, 2005, now U.S. Pat. No. 7,265,034, entitled Method of Cutting Integrated Circuit Chips From Wafer By Ablating With Laser And Cutting With Saw Blade, which application is hereby incorporated herein by reference.

This application claims the benefit of U.S. Provisional Application No. 60/654,285 filed on Feb. 18, 2005 entitled Method Of Singulating Integrated Circuit Chips From Wafer By Ablating With Laser And Cutting With Saw Blade, which application is hereby incorporated herein by reference.

TECHNICAL FIELD

The present invention generally relates to manufacturing and packaging integrated circuit chips. In one aspect, it relates more particularly to cutting integrated circuit chips from a wafer by ablating with laser beams and cutting with a saw blade.

BACKGROUND

To reduce signal delay and improve electrical performance in high speed integrated circuits, low-k dielectric materials (having a dielectric constant less than 3.9) are often implemented for the intermetal dielectric (IMD) layers of an integrated circuit chip. Low-k and ultra low-k dielectric materials are currently preferred for use in the IMD layers to reduce RC delay and parasitic capacitances. The general trend in IMD designs is that the dielectric constant (k) tends to decrease from the top downward toward the substrate. However, as the dielectric constant (k) decreases, typically the strength of the dielectric material decreases (as a general rule). Hence, many low-k dielectric materials are highly susceptible to cracking or lack strength needed to withstand some mechanical processes (e.g., wire bonding, CMP, lead-free packaging, cutting chips from wafer). Not only do low-k dielectric materials tend to be relatively weak in compression strength, they also tend to be weak in adhesion strength and shearing strength, which can cause peeling, chipping, or delamination.

Typically, the integrated circuit chips are electrically tested prior to cutting the chips from the wafer. Defective chips are marked. It is typically more efficient to test the chips before cutting them from the wafer because many chips on a wafer can be tested at one time using a probe card having an array of probe needles (e.g., to perform continuity tests).

In a conventional method of cutting integrated circuit chips from a wafer, typically cuts are made by a saw blade (e.g., diamond tip) along the cutting streets (also known as scribe lines) between chips on the wafer. During such cutting, low-k dielectric materials often suffer damage such as chipping, peeling, shearing, interlayer delamination, or cracking. However, such damage from cutting the chips occurs after testing the chips. Hence, it is important for reliability and increased production yield to eliminate or significantly reduce the number of chips damaged during a chip cutting process.

During subsequent packing processes after the chips are cut, there are many mechanical and/or thermal stresses exerted on the chip. For example, many packaging designs are moving toward or now use lead-free solder and/or lead-free balls/bumps. A lead-free packaging process will generally exert more stress on the chip than a high-lead package would due to higher reflow temperatures and more rigid lead-free ball/bump material. And at the same time, the IMD layers are using low-k dielectric materials with lower dielectric constants, which are typically weaker and more easily damaged. Any chips, delamination, cracking, or peeling of the IMD layers may spread and become larger during subsequent packaging processes. Thus, there is a great need for methods of cutting integrated circuit chips from a wafer while exerting less stress and/or causing less damage to the low-k dielectric layers (e.g., IMD layers).

SUMMARY OF THE INVENTION

The problems and needs outlined above may be addressed by embodiments of the present invention. In accordance with one aspect of the present invention, a method of cutting an integrated circuit chip from a wafer having a plurality of integrated circuit chips, is provided. This method includes the following steps described in this paragraph. The order of the steps may vary, may be sequential, may overlap, may be in parallel, and combinations thereof. An upper portion of the wafer is ablated using an energy source comprising a laser beam to form a trench that extends into the wafer from a top surface of the wafer through intermetal dielectric layers and at least partially into a substrate of the wafer. After the ablating to form the trench, cutting through the wafer between outer sidewalls of the laser-ablated trench with a saw blade is performed. A width between the outer sidewalls of the laser-ablated trench is greater than a cutting width of the saw blade. The method of the above embodiment may also include a second trench substantially parallel to the laser-ablated trench. The second trench may be formed by a second laser beam in-situ or after the laser beam mentioned above and followed by the saw blade cutting.

In accordance with another aspect of the present invention, a method of forming a packaged integrated circuit chip is provided. This method includes the following steps described in this paragraph. The order of the steps may vary, may be sequential, may overlap, may be in parallel, and combinations thereof. An upper portion of the wafer is ablated using an energy source comprising a laser beam to form a trench that extends into the wafer from a top surface of the wafer through intermetal dielectric layers and at least partially into a substrate of the wafer. The wafer has a plurality of integrated circuit chips. The trench is formed between at least two of the chips of the wafer. After the ablating to form the trench, cutting through the wafer between outer sidewalls of the laser-ablated trench with a saw blade is performed. A width between the outer sidewalls of the two laser-ablated trenches is greater than a cutting width of the saw blade. An integrated circuit chip is cut, wherein the cutting includes the ablating and saw cutting steps. The cut integrated circuit chip is attached and electrically connected to a package substrate using solder bumps. The solder bumps may be substantially lead-free, or alternatively, the solder bumps may include lead. The intermetal dielectric layers may include at least one layer of low-k dielectric material. The method of the above embodiment may also include a second trench substantially parallel to the laser-ablated trench. The second trench may be formed by a second laser beam in-situ or after the laser beam mentioned above and followed by the saw blade cutting.

In accordance with yet another aspect of the present invention, an integrated circuit chip is provided, which includes a low-k dielectric layer, a chip substrate, and an edge of the integrated circuit chip. The edge of the integrated circuit chip includes a first edge portion and a second edge portion. At least part of the first edge portion being across a same level as the low-k dielectric layer. The first edge portion has been laser ablated to have a series of rounded recesses formed therein. The second edge portion is across a same level as at least part of the chip substrate. The second edge portion has a sawed edge pattern, and the second edge portion has a different surface texture than that of the first edge portion. The second edge portion may have a sawed edge pattern. The first edge portion may be about 1 μm to about 20 μm away from a seal ring structure of the integrated circuit chip. A top surface of the integrated circuit chip may be rough. A depth of the first edge portion from a surface of the integrated circuit chip may be about 15 μm.

In accordance with still another aspect of the present invention, a packaged semiconductor chip is provided, which includes an integrated circuit chip, a packaging substrate, and a plurality of solder bumps. The integrated circuit chip includes a low-k dielectric layer and a chip substrate. An edge of the integrated circuit chip includes a first edge portion and a second edge portion. At least part of the first edge portion is across a same level as the low-k dielectric layer. The first edge portion has been laser ablated to have a series of rounded recesses formed therein. The second edge portion is across a same level as at least part of the chip substrate. The second edge portion has a different surface texture than that of the first edge portion. The packaging substrate has the integrated circuit chip attached thereto. A plurality of solder bumps are electrically connecting between the packaging substrate and the integrated circuit chip. The second edge portion may have a sawed edge pattern. The solder bumps may be substantially lead-free. For example, the solder bumps may have a lead concentration of less than about 5%. The solder bumps may comprise lead. For example, the solder bumps may be high-lead bumps with a lead concentration of greater than about 80%. The first edge portion is about 1 μm to about 20 μm away from a seal ring structure of the integrated circuit chip. A top surface of the integrated circuit chip may be rough, partially rough, or smooth, for example. The low-k dielectric layer may have a dielectric constant of less than about 3.3. The low-k dielectric layer may have a dielectric constant of less than about 2.5. The low-k dielectric layer may include silicon doped with at least one of carbon, nitrogen, fluorine, and hydrogen. A depth of the first edge portion from a surface of the integrated circuit chip may be about 15 μm.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
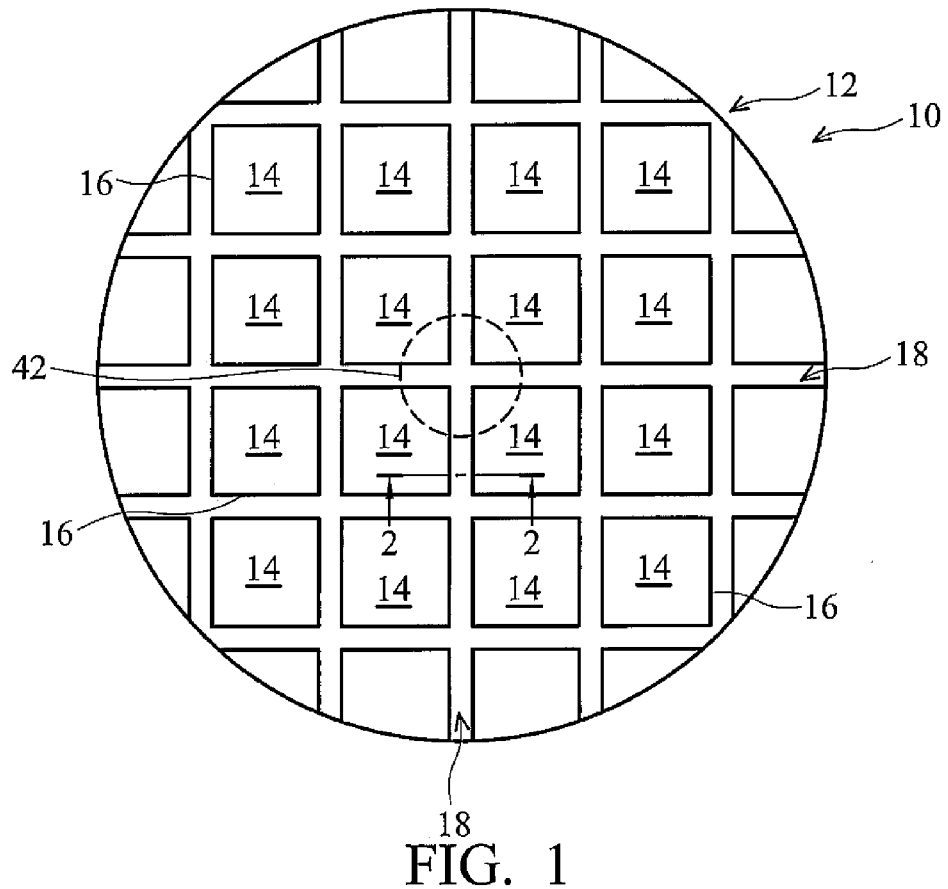
FIG. 1 is an overhead view of a wafer in accordance with a first illustrative embodiment of the present invention.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Generally, an embodiment of the present invention provides a method of cutting integrated circuit chips from a wafer by ablating the wafer with two lasers, forming two parallel trenches along the cutting streets, and then cutting the wafer with a saw blade. FIG. 1 is an overhead view 10 of a wafer 12 in accordance with the first illustrative embodiment of the present invention. Integrated circuit (IC) chips 14 have been patterned into and formed on the wafer 12. Scribe seals 16 (i.e., seal rings) may outline the outer boundaries of the IC chips 14, as shown in the illustrative embodiments herein. In other embodiments (not shown), the seal rings 16 may differ or may be omitted. The portions of the wafer 12 separating the IC chips 14 are referred to as cutting streets 18 (i.e., scribe lines).

Figure 2:
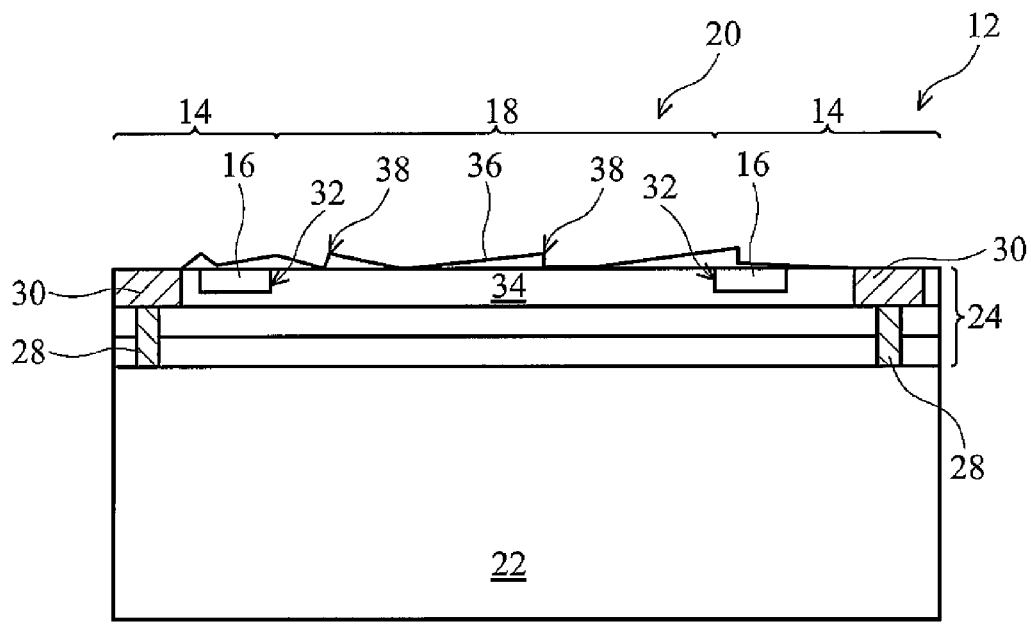
FIG. 2 is a cross-sectional view of the wafer in accordance with the first embodiment.

FIG. 2 shows a cross-sectional view 20 of the wafer 12 along the line 2-2 in FIG. 1. FIG. 2 shows a wafer substrate 22 underlying a plurality of inter-metal dielectric (IMD) layers 24. At least one of the IMD layers 24 is a low-k dielectric layer 26. The low-k dielectric layer 26 has a dielectric permittivity value (k) significantly below the dielectric permittivity of silicon dioxide (k≈4.0), such as k values less than about 3.3, and less than about 2.75, for example. The low-k dielectric layer 26 may be a carbon containing layer, a nitrogen containing material, a fluoride containing material, or a hydrogen containing material, for example. The low-k material in the low-k layer 26 is preferably doped silicon having dopants such as carbon, nitrogen, fluoride, hydrogen, or combinations thereof, for example.

In accordance with the first illustrative embodiment, FIG. 2 illustrates that conductive wires 28 in the IMD layers 24 of the IC chips 14 are electrically connected to lead-free bump pads 30. In other embodiments, however, the bump pads 30 may include lead. The cutting street 18 is the portion of the wafer between the two outer edges 32 of the scribe seals 16. It should be noted that although the scribe seal 16 is shown in FIG. 2 to have a single layer of top level metal, seal rings in other embodiments may comprise a plurality of interconnect having via openings therein. The cross sectional view 20 in FIG. 2 shows the contact pads (i.e., bump pads) 30 and the scribe seals 16 in a passivation layer 34. The top surface of the passivation layer 36 may have a rough surface with surface features such as steps 38, for example. It is noted that the surface features 38 are enlarged in FIG. 2 for illustrative purposes. Alternatively, the passivation layer top surface 36 may be a smooth surface substantially free significant surface features, such as a surface produced by a chemical mechanical polishing (CMP) step, for example.

The cross-sectional view 20 of the wafer 12 shown in FIG. 2 has a lightly doped substantially crystalline silicon substrate 22. Alternatively, wafer substrates in other embodiments may comprise germanium (Ge), silicon germanium (SiGe), silicon on insulator (SOI), and gallium arsenide (GaAs), for example.

Figure 3:
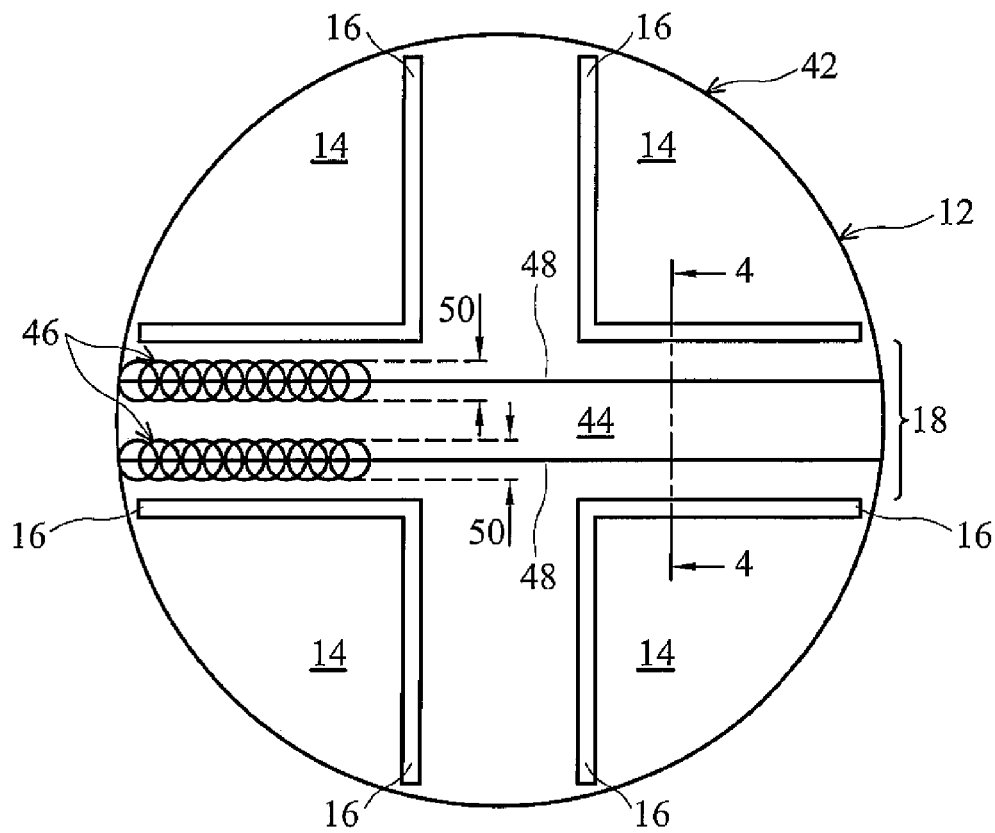
FIG. 3 is an overhead view illustrating a first step of the present invention in accordance with the first embodiment.

FIG. 3 illustrates a first step in accordance with the first illustrative embodiment. FIG. 3 is an enlarged overhead view 42 of a portion of the wafer 12 inside the dotted circle 42 of FIG. 1. The wafer 12 may be ablated by using an energy source comprising a single laser beam, a double laser beam (see e.g., FIG. 3), or others. FIG. 3 is an embodiment using a double laser beam, for example. The overhead view 42 shows an upper portion 44 of the wafer 12 is ablated using two semiconductor laser-excited, Q-switched, solid source laser beams 46. The laser beams 46 are shown in FIG. 3 as a series of closely drawn circles to illustrate the movement of the two laser beams 46 along the cutting street 18 in the direction shown by the arrows 48. Each of the two solid source laser beams 46 in FIG. 3 preferably has a pulse oscillation formation, a laser wavelength of about 355 nm, an energy of about 0.5 W to about 5 W, and a beam size 50 of about 15 μm to about 30 μm. The ablating of the upper portion 44 of the wafer 12 may alternatively be performed by other non-blade sawing energy sources. For example, the ablating step may be performed using other types of lasers, inert gases, acids, water, ion beams, and electron beams. The width $W_{scribe}$ of the plurality of scribe lines 18 are between about 10 μm to about 300 μm. In another embodiment of the present invention, a single laser beam may be employed and moved along the cutting street twice to obtain the two ablated trenches. However, two laser beam ablations are not necessarily required for an embodiment. Using only one laser beam to ablate the wafer without the use of a saw blade may be possible if the thickness of the wafer is small enough (or thin enough, e.g., about 25-50 μm). In another embodiment, where the wafer is thin enough, a single laser or double laser ablating may be performed along the scribe line 18 without the saw cutting step for the dicing process.

Figure 4:
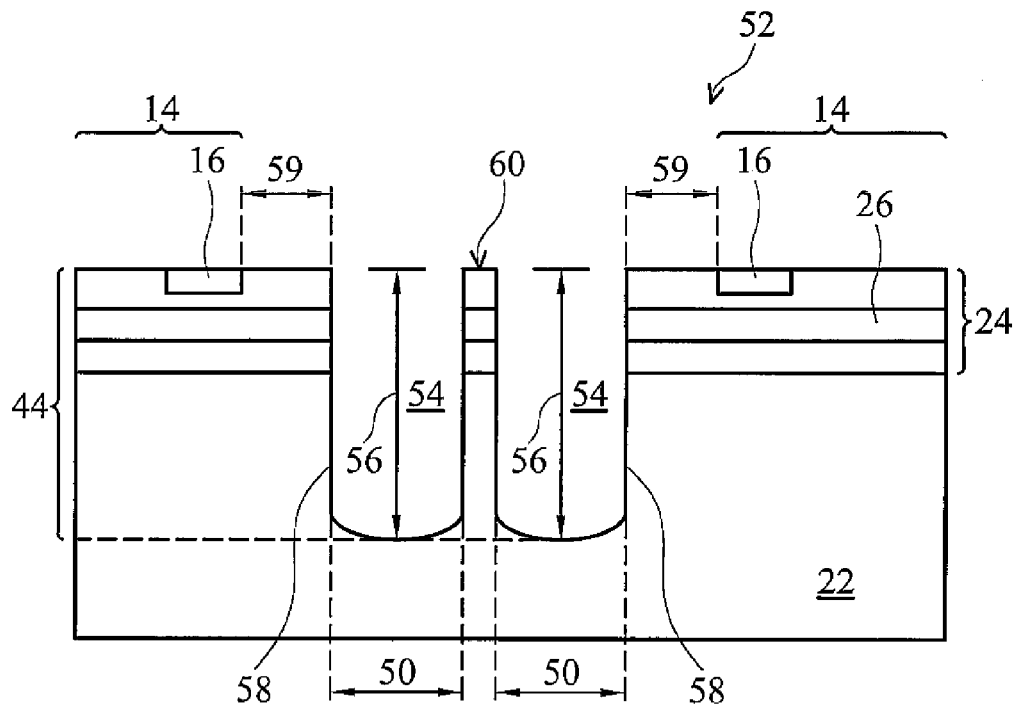
FIG. 4 is a cross-sectional view illustrating the first step of the present invention in accordance with the first embodiment.

FIG. 4 is a cross-sectional view 52 of the wafer 12 along the line 4-4 of FIG. 3, in accordance with the first step of the first illustrative embodiment. FIG. 4 shows the two laser-ablated trenches 54 (or grooves) resulting from the ablating step. Each of the two laser-ablated trenches 54 preferably has a depth 56 of about 15 μm from the wafer top surface 36. The trenches 54 preferably extend at least partially into the wafer substrate 22.

Each laser-ablated trench 54 has an edge 58 that is closest to an IC chip 14. At least part of each outer edge 58 crosses the low-k dielectric layer 26. The spacing 59 between a trench edge 58 and a scribe seal ring 16 of an IC chip 14 on the wafer 12 is preferably between about 5 μm to about 15 μm. In other illustrative embodiments, the spacing 59 is preferably between about 1 μm to about 20 μm, for example. This spacing 59 will typically depend upon the street width 18 and the saw blade width, but also may need to be large enough to provide a buffer zone allowing for misalignments or other manufacturing factors.

Figure 5:
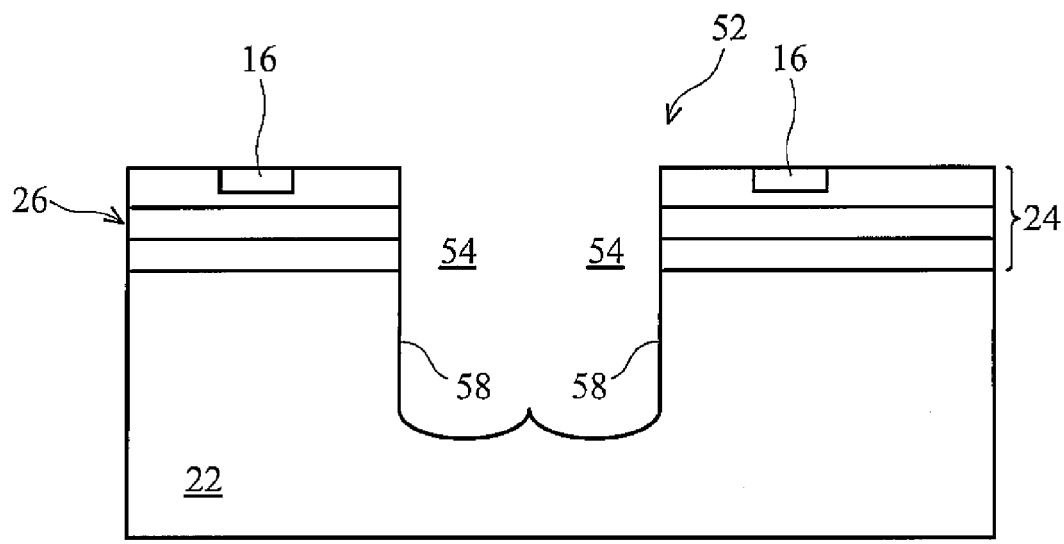
FIG. 5 is a cross-sectional view illustrating a first step of the present invention in accordance with a second illustrative embodiment of the present invention.

It should be noted that the two laser-ablated trenches 54 in FIG. 4 are separated by a portion 60 of the wafer 12, which includes a portion of the IMD layers 24 and a portion of the substrate 22. In a second illustrative embodiment, however, the two laser-ablated trenches 54 are formed directly adjacent to one another, as shown in FIG. 5. In a third embodiment, there is only a single laser beam used and the portion 60 exists, for example. Whether a portion 60 remains after the laser ablating step will depend (among other things) upon the spacing chosen for the laser beams 46 relative to each other and the width of the laser beams 46 at the ablation site.

Figure 6:
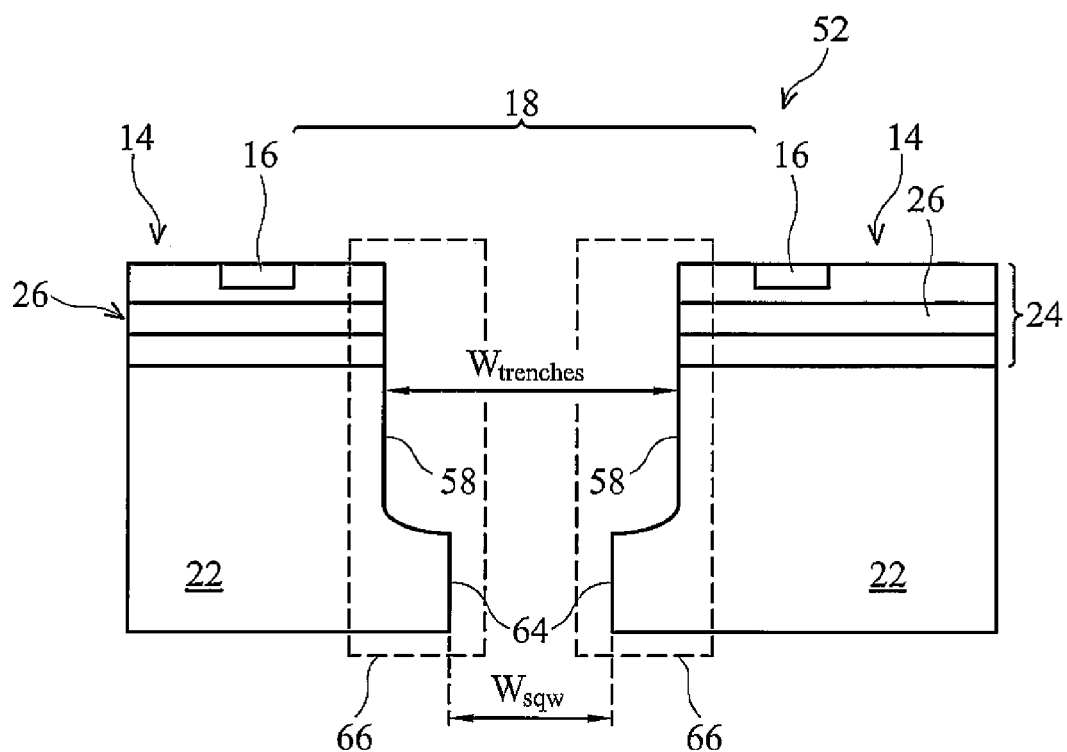
FIG. 6 is a cross-sectional view illustrating a second step of the present invention in accordance with the second embodiment.

With reference again to the first illustrative embodiment, a subsequent step to the ablating step is shown in the cross-sectional view 52 of the wafer in FIG. 6. One or more cuts are made in the cutting street 18 and between the trench edges 58 with a saw blade (not shown). The saw blade preferably cuts the wafer 12 at a sawing speed of about 1 μm/s to about 100 μm/s. The saw blade cutting may be performed at a feeding speed in the range of about 10 μm/s to about 500 μm/s. The saw blade may be any blade suitable for cutting semiconductor wafers, such as a diamond tipped saw blade, for example.

As shown in FIG. 6, the cutting width of the saw blade $W_{saw}$ separates the two edges 64 of the wafer silicon substrate 22. The width $W_{trenches}$ between the trench edges 58 of the two laser-ablated trenches 54 is preferably greater than the cutting width $W_{saw}$. In another embodiment, there is only a single laser beam used, the width $W_{trenches}$ between the trench edges of the laser-ablated trench is also preferably greater than the cutting width $W_{saw}$. Because the width $W_{trenches}$ is preferably greater than the width $W_{saw}$, each IC chip 14 will have multiple edges 58, 64 along each side 66.

With reference to FIG. 1, the combination of the non-blade ablating step and the subsequent saw blade cutting step of the first illustrative embodiment may be repeated any number of times along any number of cutting streets 18 in the wafer 12, in order to cut any number of IC chips 14 from the wafer 12.

Figure 7:
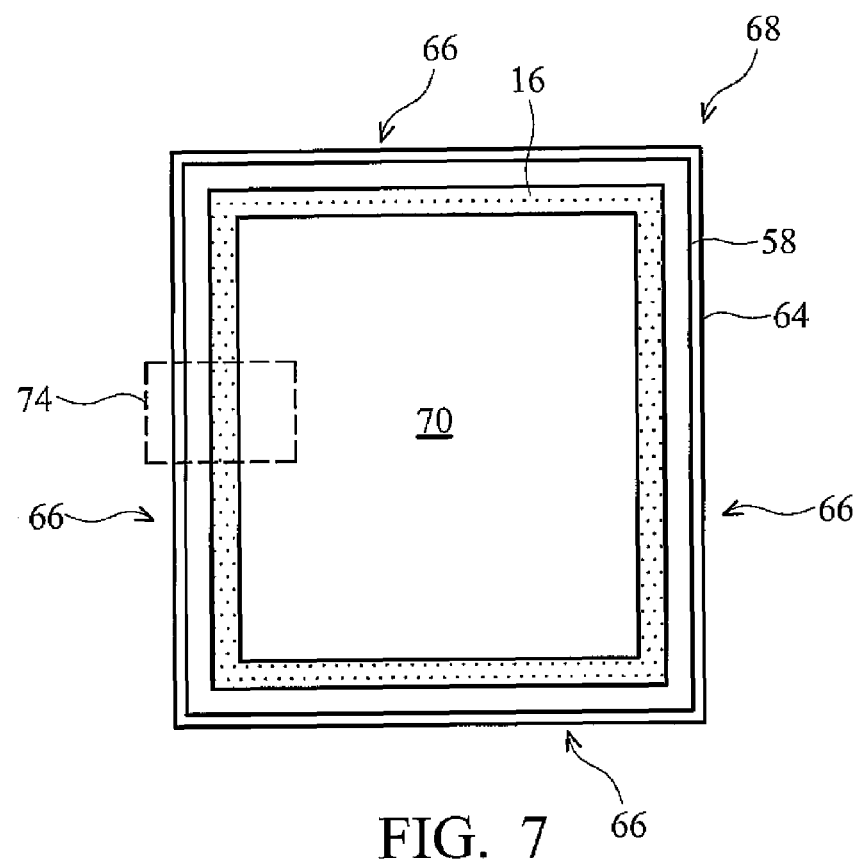
FIG. 7 is an overhead view showing a cut chip in accordance with the first illustrative embodiment of the present invention.
Figure 8:
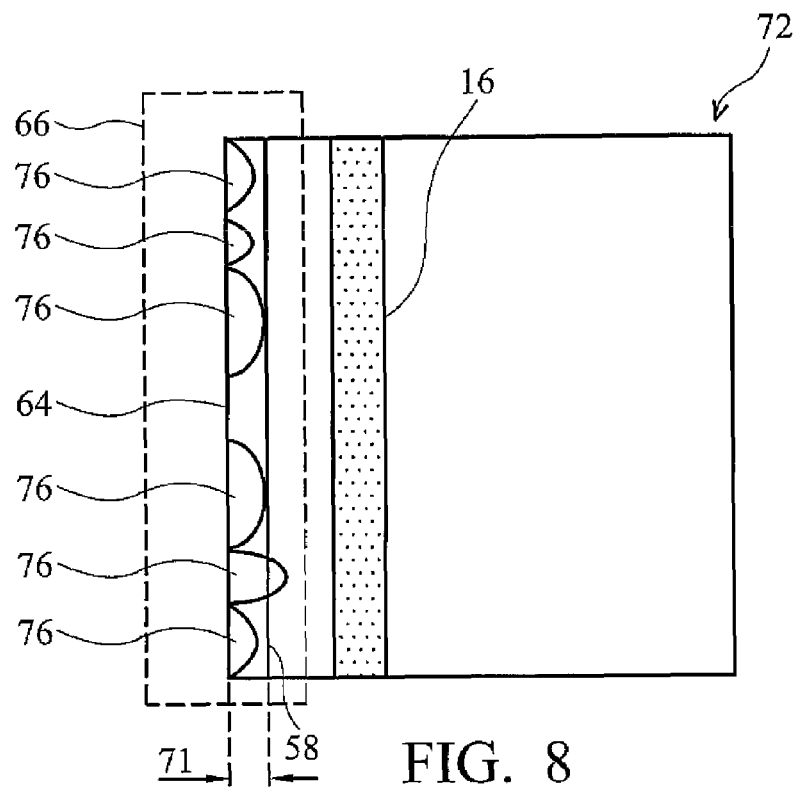
FIG. 8 is an enlarged view showing a portion of the chip in accordance with the first embodiment.

FIG. 7 shows an overhead view 68 of an integrated circuit (IC) chip 70, which has been cut from the wafer 12 using the method of the present invention and in accordance with the first illustrative embodiment. Each side 66 of the cut IC chip 70 has at least two edges 58 and 64, as discussed above. An enhanced overhead view 72 of the portion of the cut IC chip 70 inside the dotted rectangle 74 in FIG. 7 is shown in FIG. 8. The horizontal spacing 71 (see FIG. 8) between the trench edge 58 and the saw blade edge 64 may be characterized by half of ($W_{trench}-W_{saw}$). The horizontal spacing 71 is preferably about 1 μm to about 30 μm. The depth of the edge 68 on chip 70 using a method of the present invention is preferably more than about 50 μm, and more preferably larger than about 100 μm.

FIG. 8 shows rounded portions 76 formed in the side 66 of the IC chip 70. The rounded portions 76 are grooves formed in the sides 66 of the IC chip 70 between the trench edges 58 and the saw-blade edges 64. The grooves 76 are formed in the upper portion 44 (See e.g., FIG. 4) of the wafer substrate 12 by the lasers 46 during the ablating step. The grooves 76 may appear in patterns of continuous and un-continuous groups, single grooves, and combinations thereof, for example.

In accordance with the first illustrative embodiment, the IC chip 70 is preferably exposed to ultraviolet irradiation subsequent to being cut and before packaging. In other illustrative embodiments of the present invention, IC chips may bypass the ultraviolet irradiation step before packaging.

Figure 9:
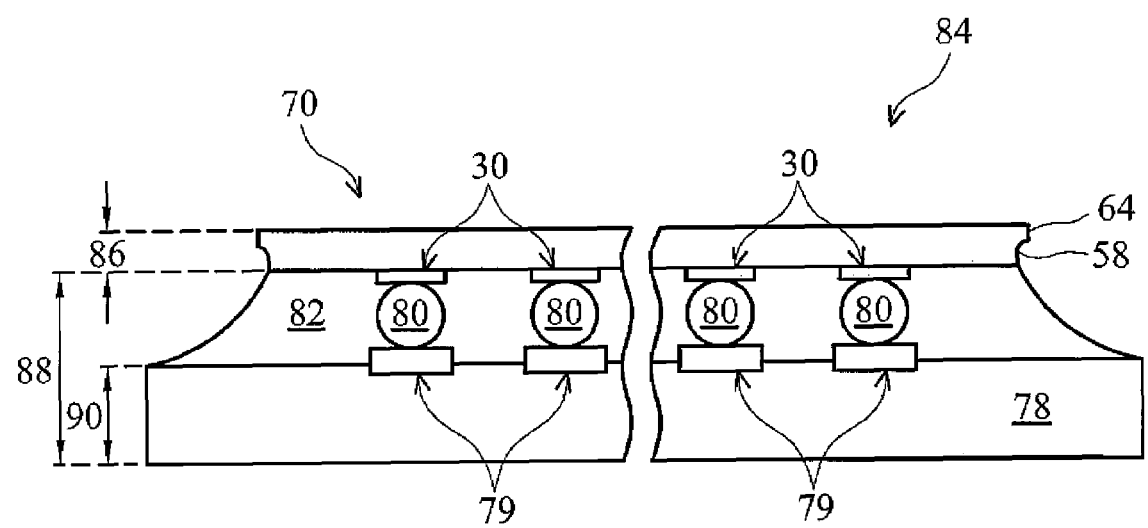
FIG. 9 is a cross-sectional illustrating a packaged chip in accordance with the first embodiment of the present invention.

In accordance with the first illustrative embodiment, the IC chip 70 is packaged into a flip chip configuration. A cross sectional view 84 of the flip chips packaging is shown in FIG. 9. FIG. 9 illustrates that the contact pads 30 of the IC chip 70 that are electrically connected to the contact pads 79 of a flip-chip substrate 78 by solder bumps 80. An underfill material 82 surrounds the solder bumps 80 and substantially fills the space separating the substrate 78 and the IC chip 70. The underfill material 82 is preferably an epoxy containing material. The IC chip contact pads 30 and solder bumps 80 preferably contain less than about 5% of lead material. Alternatively, the IC chip contact pads 30 and solder bumps 80 may be high-lead bumps containing at least 80% of lead material. In other illustrative embodiments, under bump metallurgy (UBM) may be used to electrically connect cut IC chips to substrates in a manner similar to that shown in FIG. 9.

The total thickness 86 of the semiconductor IC chip 70, diced from a 12 inch wafer 12 (See e.g., FIG. 1) is preferably about 31 mil. Alternatively, IC chips may be cut using the method of the present invention from wafers having other diameters and thicknesses. For example, in another illustrative embodiment an IC chip is diced using the method of the present invention from an 8 inch wafer, which has a thickness of about 29 mil. Referring to FIG. 9, the thickness 88 from the bottom surface of the substrate to the top surface where bond pads are located is about 1.1 mm to about 1.3 mm. The thickness of the flip-chip substrate 90 is about 1 mm to about 1.2 mm.

Significant advantages may be achieved in illustrative embodiments of the present invention. Laser ablating causes significantly less damage to the structural integrity of characteristically brittle low-k IMD layers than the saw blade cutting does. Preserving the structural integrity of the low-k IMD layers during the wafer dicing process contributes to the prevention of backside chipping, peeling and interlayer delamination during subsequent manufacturing and testing steps, including the typically stressful lead-free packaging step. Therefore, the method of the present invention may significantly improve yield of semiconductor chips, which use low-k IMD materials and lead-free packaging materials.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit chip comprising:
   a low-k dielectric layer;
   a chip substrate;
   an edge of the integrated circuit chip comprising a first edge portion and a second edge portion,
      at least part of the first edge portion being across a same level as the low-k dielectric layer, and the first edge portion having been laser ablated to have a series of rounded recesses formed therein, and
      the second edge portion being across a same level as at least part of the chip substrate, the second edge portion having a sawed edge pattern, and the second edge portion having a different surface texture than that of the first edge portion.

2. The integrated circuit chip of claim 1, further comprising solder bumps that comprise a lead concentration of less than about 5%.

3. The integrated circuit chip of claim 1, further comprising solder bumps that comprise a lead concentration of greater than about 80%.

4. The integrated circuit chip of claim 1, wherein the first edge portion is about 1 μm to about 20 μm away from a seal ring structure of the integrated circuit chip.

5. The integrated circuit chip of claim 1, wherein a top surface of the integrated circuit chip is rough.

6. The integrated circuit chip of claim 1, wherein a depth of the first edge portion from a surface of the integrated circuit chip is about 15 μm.

7. The integrated circuit chip of claim 1, wherein the low-k dielectric layer has a dielectric constant of less than about 3.3.

8. A packaged semiconductor chip comprising:
   an integrated circuit chip comprising a low-k dielectric layer and a chip substrate, wherein an edge of the integrated circuit chip comprises a first edge portion and a second edge portion,
      at least part of the first edge portion being across a same level as the low-k dielectric layer, and the first edge portion having been laser ablated to have a series of rounded recesses formed therein, and
      the second edge portion being across a same level as at least part of the chip substrate, and the second edge portion having a different surface texture than that of the first edge portion;
   a packaging substrate having the integrated circuit chip attached thereto; and
   a plurality of solder bumps electrically connecting between the packaging substrate and the integrated circuit chip.

9. The packaged semiconductor chip of claim 8, wherein the second edge portion has a sawed edge pattern.

10. The packaged semiconductor chip of claim 8, wherein the solder bumps are substantially lead-free.

11. The packaged semiconductor chip of claim 10, wherein the solder bumps comprise a lead concentration of less than about 5%.

12. The packaged semiconductor chip of claim 8, wherein the solder bumps comprise lead.

13. The packaged semiconductor chip of claim 12, wherein the solder bumps comprise a lead concentration of greater than about 80%.

14. The packaged semiconductor chip of claim 8, wherein the first edge portion is about 1 μm to about 20 μm away from a seal ring structure of the integrated circuit chip.

15. The packaged semiconductor chip of claim 8, wherein a top surface of the integrated circuit chip is rough.

16. The packaged semiconductor chip of claim 8, wherein the low-k dielectric layer has a dielectric constant of less than about 3.3.

17. The packaged semiconductor chip of claim 8, wherein the low-k dielectric layer has a dielectric constant of less than about 2.5.

18. The packaged semiconductor chip of claim 8, wherein the low-k dielectric layer comprises silicon doped with at least one of carbon, nitrogen, fluorine, and hydrogen.

19. The packaged semiconductor chip of claim 8, wherein a depth of the first edge portion from a surface of the integrated circuit chip is about 15 μm.

20. A packaged semiconductor chip comprising:
- an integrated circuit chip comprising a low-k dielectric layer and a chip substrate, wherein an edge of the integrated circuit chip comprises a first edge portion and a second edge portion,
  - at least part of the first edge portion being across a same level as the low-k dielectric layer, and the first edge portion having been laser ablated to have a series of rounded recesses formed therein, and
  - the second edge portion being across a same level as at least part of the chip substrate, the second edge portion having a sawed edge pattern, and the second edge portion having a different surface texture than that of the first edge portion;
- a packaging substrate having the integrated circuit chip attached thereto; and
- a plurality of substantially-lead-free solder bumps electrically connecting between the packaging substrate and the integrated circuit chip.

* * * * *